US012805150B2

(12) United States Patent
Kim et al.

(10) Patent No.: US 12,805,150 B2
(45) Date of Patent: Nov. 17, 2026

(54) DISPLAY PANEL INCLUDING A FILLING LAYER

(71) Applicant: SAMSUNG DISPLAY CO., LTD., Yongin-si (KR)

(72) Inventors: Hwiseong Kim, Seongnam-si (KR); Hoisoo Kwon, Pyeongtaek-si (KR); Donghoo Kim, Cheonan-si (KR); Yujin Ye, Asan-si (KR); Seungwon Lee, Cheonan-si (KR); Jae-Man Lee, Anyang-si (KR); Hee-Won Yoon, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 612 days.

(21) Appl. No.: 17/664,860

(22) Filed: May 24, 2022

(65) Prior Publication Data

US 2023/0055784 A1 Feb. 23, 2023

(30) Foreign Application Priority Data

Aug. 18, 2021 (KR) ........................ 10-2021-0109072

(51) Int. Cl.
*H10K 59/65* (2023.01)
*H10K 59/80* (2023.01)
*H10K 71/00* (2023.01)

(52) U.S. Cl.
CPC ........... *H10K 59/65* (2023.02); *H10K 59/873* (2023.02); *H10K 71/00* (2023.02)

(58) Field of Classification Search
None
See application file for complete search history.

(56) References Cited

U.S. PATENT DOCUMENTS

| | | | | |
|---|---|---|---|---|
| 10,673,020 | B2 | 6/2020 | Kim | |
| 10,741,788 | B2 | 8/2020 | Won et al. | |
| 11,818,940 | B2 | 11/2023 | Sung et al. | |
| 11,899,862 | B2 | 2/2024 | Bok et al. | |
| 2019/0326544 | A1* | 10/2019 | Huang ................. | H10K 50/844 |
| 2020/0106046 | A1 | 4/2020 | Kim | |

(Continued)

FOREIGN PATENT DOCUMENTS

| | | | | |
|---|---|---|---|---|
| CN | 114512514 A * | 5/2022 | ........... | H10K 50/844 |
| KR | 10-2020-0036130 A | 4/2020 | | |

(Continued)

OTHER PUBLICATIONS

Office Action dated Nov. 18, 2024, in corresponding Korean Patent Application No. 10-2021-0109072, 9 pages.

*Primary Examiner* — Sarah K Salerno
(74) *Attorney, Agent, or Firm* — F. CHAU & ASSOCIATES, LLC

(57) ABSTRACT

A display panel includes a substrate including a first area, a second area surrounding the first area, and a third area surrounding the second area, and a barrier part disposed on the substrate in the second area and including a first partition including a concave-convex structure on a surface facing the first area in a plan view. The display panel further includes a filling layer disposed on the substrate in the first area and the second area and adjacent to the concave-convex structure and a light emitting diode layer disposed in the third area on the substrate and adjacent to the first partition.

9 Claims, 12 Drawing Sheets

(56) References Cited

U.S. PATENT DOCUMENTS

| | | | | |
|---|---|---|---|---|
| 2020/0194714 | A1 | 6/2020 | Won et al. | |
| 2021/0005683 | A1* | 1/2021 | Sung | H10K 59/123 |
| 2021/0118965 | A1* | 4/2021 | Wang | H10K 71/00 |
| 2021/0191552 | A1 | 6/2021 | Bok et al. | |
| 2022/0158127 | A1* | 5/2022 | Lee | H10K 59/131 |
| 2024/0184390 | A1 | 6/2024 | Bok et al. | |

FOREIGN PATENT DOCUMENTS

| | | | | | |
|---|---|---|---|---|---|
| KR | 10-2020-0073544 | A | | 6/2020 | |
| KR | 10-2171375 | | | 10/2020 | |
| KR | 10-2021-0005446 | A | | 1/2021 | |
| KR | 10-2021-0082316 | A | | 7/2021 | |
| KR | 20220067655 | A | * | 5/2022 | H10K 50/844 |

* cited by examiner

DISPLAY PANEL INCLUDING A FILLING LAYER

CROSS-REFERENCE TO RELATED APPLICATION(S)

This application claims priority under 35 USC § 119 to Korean Patent Application No. 10-2021-0109072, filed on Aug. 18, 2021 in the Korean Intellectual Property Office (KIPO), the entire disclosure of which is incorporated by reference herein.

TECHNICAL FIELD

Embodiments relate to a display device. More particularly, embodiments relate to a display panel of the display device that includes a filling layer.

DISCUSSION OF THE RELATED ART

Display devices have seen increased demand from consumers in recent times. Display devices are used to facilitate a connection between users and information. Accordingly, the use of many types of display devices such as liquid crystal displays, an organic light emitting displays, and others has also increased.

A functional module (e.g., a camera module, etc.) may be disposed on a display device so that a user may perform various functions using the display device. For example, the functional module may be disposed on or within the display panel in order to face the user and to provide more usable screen area.

In this case, there may be layers formed over the functional module in order to protect it. However, while the layers may offer protection from foreign material, they may cause less light to reach the functional module. In order for the functional module to function efficiently, it is necessary to increase a transmittance of external light incident on the functional module.

SUMMARY

Embodiments provide a display panel with improved defect rate in a manufacturing process.

A display panel according to an embodiment includes a substrate including a first area, a second area surrounding the first area, and a third area surrounding the second area, a barrier part disposed on the substrate in the second area, wherein the barrier part includes a first partition including a concave-convex structure. The concave-convex structure is formed on a surface of the first partition facing the first area in a plan view. The display panel further includes a filling layer disposed on the substrate in the first area and the second area and adjacent to the concave-convex structure and a light emitting diode layer disposed in the third area on the substrate and adjacent to the first partition.

In an embodiment, the concave-convex structure may include convex portions and concave portions, wherein the convex portions protrude the second area to the first area, and wherein the concave portions are each positioned between adjacent convex portions among the convex portions.

In an embodiment, the concave-convex structure may have a saw tooth shape. In an embodiment, the concave-convex structure may have a gear shape.

In an embodiment, the barrier part may further include a second partition disposed in the second area on the substrate, wherein the second partition surrounds the first area, and wherein the second partition is spaced apart from the concave-convex structure.

In an embodiment, a thickness of the second partition may be less than a thickness of the first partition.

In an embodiment, a length between the second partition and each of the convex portions may be less than a length between the second partition and each of the concave portions in a plan view.

In an embodiment, the barrier part may further include an insulation layer disposed in the second area on the substrate, and the first partition and the second partition may be disposed on the insulation layer.

In an embodiment, a surface tension of the insulation layer may be less than a surface tension of the substrate.

In an embodiment, the first partition may extend along a boundary between the second area and the third area.

A display panel according to an embodiment includes a substrate including a first area, a second area surrounding the first area, and a third area surrounding the second area, an insulation layer disposed on the substrate in the second area, and defining a first groove spaced apart from the first area, a first partition disposed on the insulation layer in the second area, and spaced apart from the first groove, a filling layer disposed on the substrate in the first area and the second area and overlapping the first groove, and a light emitting diode layer disposed on the substrate in the third area and adjacent to the first partition.

In an embodiment, the first groove may expose an upper surface of the substrate.

In an embodiment, the insulation layer may further define a second groove spaced apart from the first groove and adjacent to the first partition.

In an embodiment, a depth of the first groove of the insulation layer may be less than a thickness of a portion of the insulation layer which overlaps the first partition.

In an embodiment, the display panel may further include a second partition disposed on the insulation layer in the second area, wherein the second partition surrounds the first area, and wherein the second partition is spaced apart from the first groove.

In an embodiment, the insulation layer may define the first groove between the first partition and the second partition.

A display panel according to an embodiment includes a substrate including a first area, a second area surrounding the first area, and a third area surrounding the second area, an insulation layer disposed on the substrate in the second area, a first partition disposed on the insulation layer in the second area, and spaced apart from the first area, a first spacer disposed on the substrate in the first area, a second spacer disposed on the insulation layer in the second area, a filling layer disposed on the substrate in the first area and the second area and overlapping each of the first spacer and the second spacer, a light emitting diode layer disposed in the third area on the substrate and adjacent to the first partition, and an encapsulation layer disposed on the filling layer, the first partition, and the light emitting diode layer.

In an embodiment, a volume of the first spacer may be equal to a volume of the second spacer.

In an embodiment, the first spacer and the second spacer may include a same kind of flexible material.

In an embodiment, the display panel may further include a second partition disposed on the insulation layer and disposed between the first spacer and the second spacer.

In an embodiment, a length between an upper surface of the substrate and a lower surface of the encapsulation layer in the first area may be less than a length between the upper surface of the substrate and the lower surface of the encapsulation layer in the second area.

In a display panel according to embodiments of the present disclosure, a filling layer includes a filling material and the filling material may charge the first area overlapping the functional module positioned under the display panel and the second area adjacent to the first area. As used herein, “charge” may refer to the process of filling an empty area. For example, a “charge rate” may refer to a filling rate of the empty area. The barrier part may be disposed in the second area, and the barrier part may include a first partition, a second partition, and an insulation layer. The volume between the insulation layer and the encapsulation layer of the second area may increase by increasing the volume of the space between the first partition and the second partition of the barrier part disposed in the second area. Accordingly, the charging rate of the filling material in the second area may decrease. The charging rate of the filling material in the first area may be similar to the charging rate of the filling material in the second area.

Since the charging rate of the filling material in the second area is similar to the charging rate of the filling material in the first area, the filling layer may charge the first area before the second area. Accordingly, the filling layer may completely charge a space in the first area on the substrate. Accordingly, a light transmittance to the functional module disposed under the filling layer in the first area may be increased, and performance of the functional module may be improved.

DETAILED DESCRIPTION OF THE EMBODIMENTS

Figure 1:
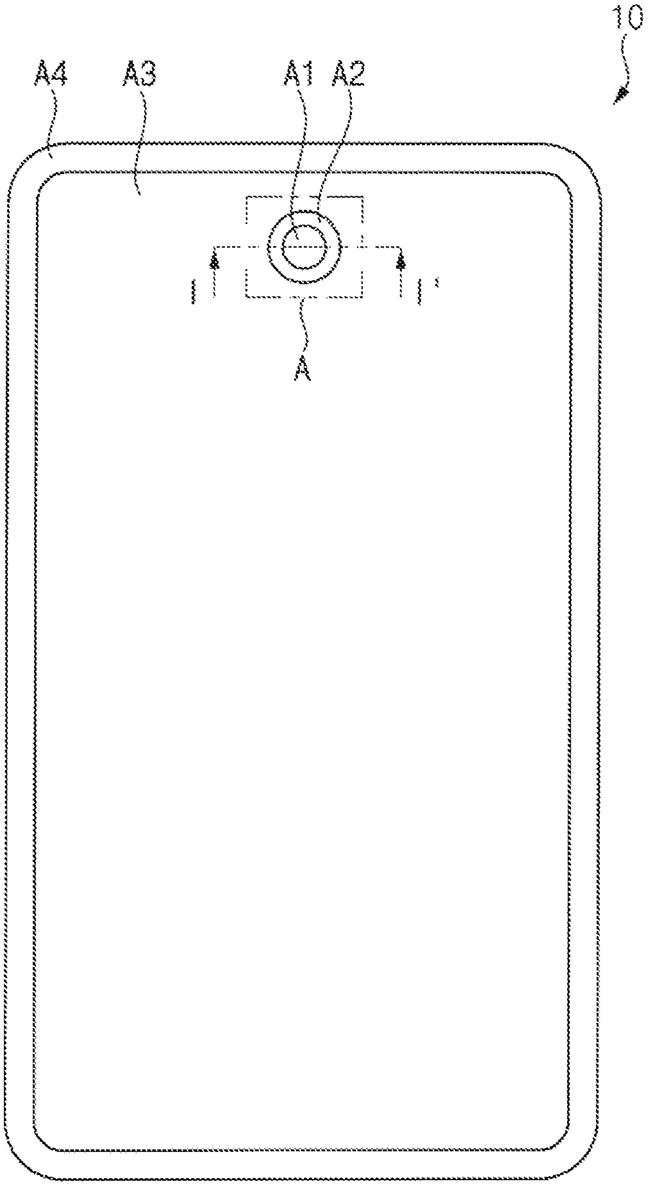
FIG. 1 is a plan view of a display device according to an embodiment.

Hereinafter, display devices in accordance with embodiments will be described in more detail with reference to the accompanying drawings. Throughout the specification, like reference symbols in the drawings may denote like elements, and to the extent that a description of an element has been omitted, it may be understood that the element is at least similar to corresponding elements that are described elsewhere in the specification.

FIG. 1 is a plan view of a display device according to an embodiment.

Referring to FIG. 1, a display device 10 may be divided into a first area A1, a second area A2, a third area A3, and a fourth area A4.

The first area A1 may be a non-display area which does not display an image. The first area A1 may be an area through which external light is transmitted. For example, the first area A1 may be a hole area in which an opening (hole) is disposed, and a functional module may be disposed in the first area A1.

The second area A2 may at least partially surround the first area A1. For example, the second area A2 may surround lateral side(s) of the first area A1. The second area A2 may be a boundary between the first area A1 and the third area A3. A barrier part may be disposed in the second area A2. The third area A3 may at least partially surround the second area A2. The third area A3 may be a display area for displaying images on the screen. A display element layer including pixels may be disposed in the third area A3. The fourth area A4 may at least partially surround the third area A3. The fourth area A4 may be a non-display area which does not display images. A driver which transmits signals and voltages to the third area A3 and a controller which controls the driver may be disposed in the fourth area A4.

However, the present disclosure is not necessarily limited thereto, and for example, the pixels may be disposed in the first area A1, the second area A2, and the fourth area A4. In another example, the first area A1, the second area A2 and the fourth area A4 may also display a screen.

The first area A1 may be located at an edge of the third area A3. The first area A1 and the second area A2 may each have a circular shape. The first area A1 and the second area A2 may be concentric with each other. Each of the third area A3 and the fourth area A4 may have a rectangular shape with rounded corners. However, the shape of each of the first area A1, the second area A2, the third area A3, and the fourth area A4 is not necessarily limited thereto, and may include various shapes such as a square, a triangle, etc.

Figure 2:
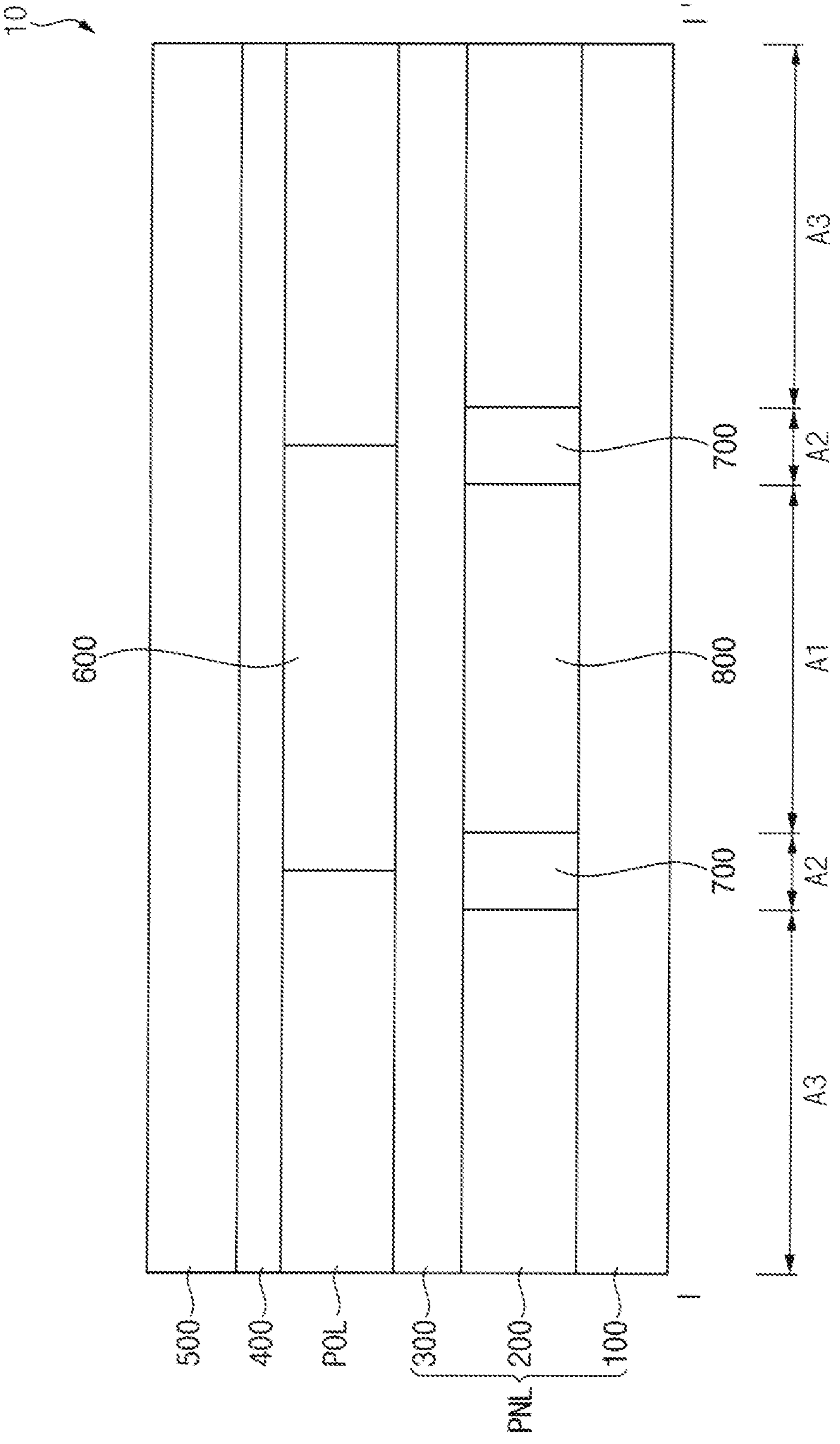
FIG. 2 is a cross-sectional view taken along line I-I' of FIG. 1.

FIG. 2 is a cross-sectional view taken along line I-I' of FIG. 1.

Referring to FIGS. 1 and 2, the display device 10 may include a display panel PNL, a functional module, a polarization layer POL, a resin layer 600, an adhesive layer 400, and a window 500. The display panel PNL may include a substrate 100, a display element layer 200, a barrier part 700, a filling layer 800, and an encapsulation layer 300.

The substrate 100 may be formed of a transparent or opaque material. The substrate 100 may be formed of glass, quartz, plastic, or the like. In an embodiment, the substrate 100 may be formed of glass. Accordingly, the substrate 100 including glass may have a relatively greater surface tension than a substrate including plastic.

The functional module may be disposed under the substrate 100. The functional module may overlap the first area A1. As used herein, “overlap” refers to an overlapping in a vertical direction that is normal to a front surface of the display device 10, unless indicated otherwise by context. Further, “surround” may refer to one component surrounding another as viewed from a horizontal plane orthogonal to the vertical direction. The intended meanings of “overlap”

and "surround" will be clear by the context of the description and the Figures. Examples of the functional module include a camera module, a face recognition sensor module, a pupil recognition sensor module, an acceleration sensor module, a proximity sensor module, an infrared sensor module, and an illuminance sensor module. The camera module may be a module that captures (or recognizes) an image of an object located in front of the display device. The face recognition sensor module may detect a user's face. The pupil recognition sensor module may detect a user's pupil. The acceleration sensor module determine a movement of the display device. The proximity sensor module and the infrared sensor module may detect whether a front surface of the display device is in proximity with an object. The illuminance sensor module may measure a degree of external brightness.

The display element layer 200 may be disposed in the third area A3 on the substrate 100. The display element layer 200 may include a circuit element layer (e.g., a circuit element layer 210 of FIG. 3) and a light emitting diode layer (e.g., the light emitting diode layer 220 of FIG. 3). The circuit element layer 210 may include insulation layers and conductive layers. The light emitting diode layer 220 may be disposed on the circuit element layer 210. The light emitting diode layer 220 may include a pixel defining layer (e.g., the pixel defining layer PDL of FIG. 3) and a light emitting diode. The light emitting diode layer 220 may emit light, and the circuit element layer 210 may drive the light emitting diode layer 220.

The filling layer 800 may be disposed in the first area A1 and the second area A2 on the substrate 100. The filling layer 800 may charge an opening overlapping the first area A1 on the substrate 100. As used herein, "charge" refers to a process in manufacturing of filling an empty space with material. Since the first area A1 is a light-transmitting area, light may pass through the display panel PNL through the opening. Accordingly, the light may be incident on the functional module positioned under the display panel PNL through the opening.

The barrier part 700 may be disposed in the second area A2 on the substrate 100. Wirings may be disposed under the barrier part 700. The barrier part 700 may cover the wirings and may have a substantially flat upper surface without having a stepped change in height around the wirings. The barrier part 700 may prevent the wirings from being visually recognized to the outside of the display device 10. In addition, the barrier part 700 may prevent the filling layer 800 disposed in the first area A1 and the second area A2 from flowing from the second area A2 to the third area A3, for example, during a manufacturing process.

The encapsulation layer 300 may be disposed on the display element layer 200, the barrier part 700, and the filling layer 800. The encapsulation layer 300 may prevent moisture and oxygen from penetrating into the display element layer 200.

The polarization layer POL may be disposed on the encapsulation layer 300. The polarization layer POL may overlap the third area A3. The polarization layer POL may partially or entirely overlap the second area A2. The polarization layer POL may selectively transmit light emitted from the display element layer 200.

The resin layer 600 may be disposed on the encapsulation layer 300. The resin layer 600 may charge an opening overlapping the first area A1 on the encapsulation layer 300. Since the first area A1 is a light-transmitting area, light may pass through the display panel PNL through the opening. Accordingly, the light may be incident on the functional module disposed under the display panel PNL through the opening.

The adhesive layer 400 may be disposed on the polarization layer POL and the resin layer 600. The adhesive layer 400 may include an adhesive material and may adhere the window 500 to a lower structure. The lower structure may include the polarization layer POL and/or the resin layer 600.

The window 500 may be disposed on the adhesive layer 400. The window 500 may protect the lower structure and allow incident external light to pass through to the functional module. For example, the window 500 may be formed of transparent glass or transparent plastic.

Figure 3:
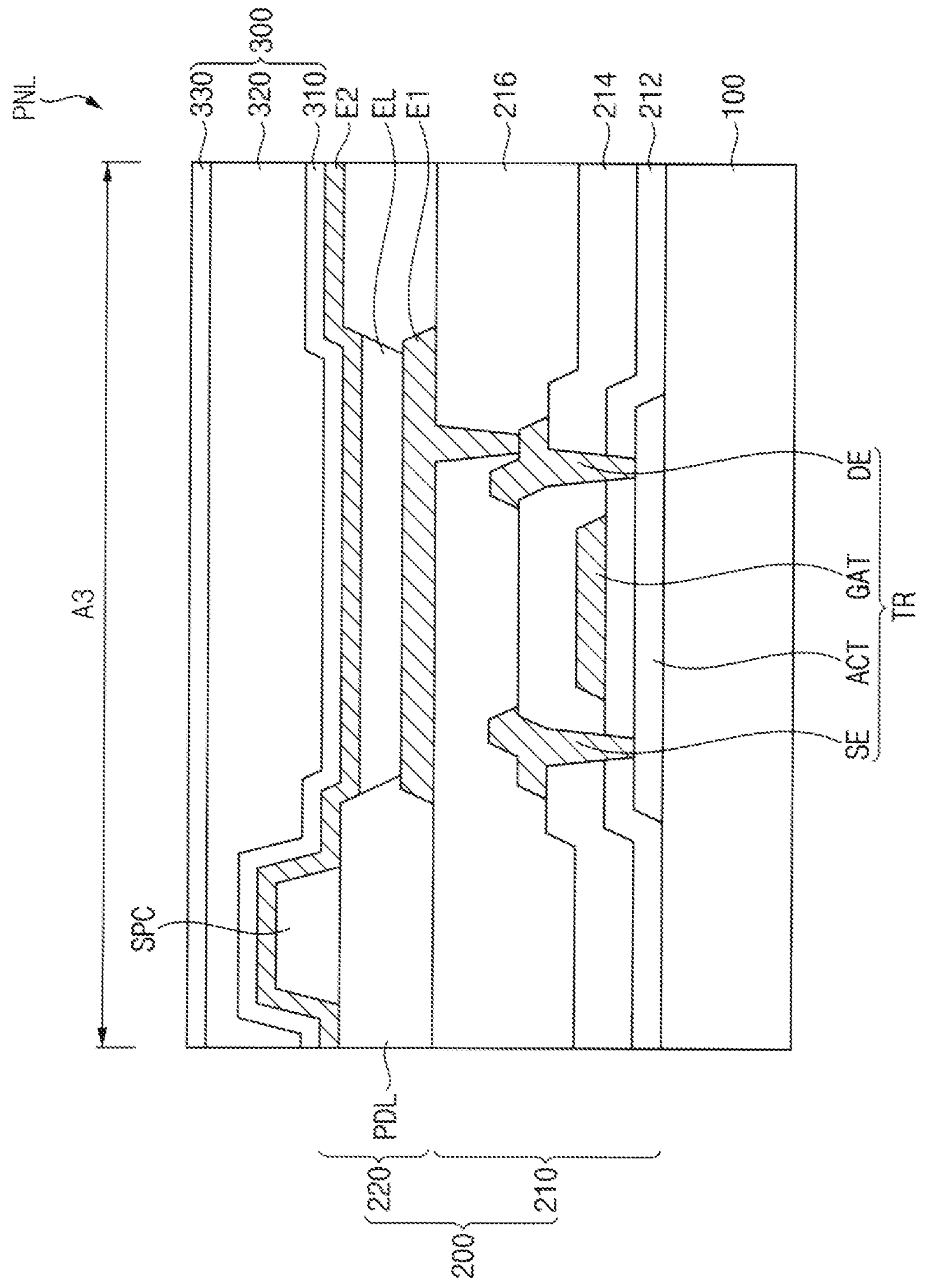
FIG. 3 is a cross-sectional view that illustrates a display panel in a third area of FIG. 2.

FIG. 3 is a cross-sectional view that illustrates a display panel in a third area of FIG. 2.

Referring to FIGS. 2 and 3, the display panel PNL may include the substrate 100, the display element layer 200, the barrier part 700, the filling layer 800, and the encapsulation layer 300. The display element layer 200 may include the circuit element layer 210 and the light emitting diode layer 220.

The circuit element layer 210 may be disposed on the substrate 100, and may include a buffer layer, at least one transistor TR, a first insulation layer 212, a second insulation layer 214, and a third insulation layer 216. The transistor TR may include an active layer ACT, a gate electrode GAT, a source electrode SE, and a drain electrode DE. The light emitting diode layer 220 may be disposed on the circuit element layer 210 and may include a pixel defining layer PDL, a gap maintaining member SPC, and a light emitting diode. The light emitting diode may include a first electrode E1, a light emitting layer EL, and a second electrode E2.

The buffer layer may be disposed on the substrate 100. The buffer layer may prevent diffusion of metal atoms or impurities from the substrate 100 into the active layer ACT.

The active layer ACT may be disposed on the substrate 100. The active layer ACT may be divided into a source region and a drain region which are each doped with impurities, and a channel region between the source region and the drain region.

The first insulation layer 212 may be disposed on the buffer layer. The first insulation layer 212 may cover the active layer ACT and may have substantially the same thickness along a profile of the active layer ACT. The first insulation layer 212 may be formed of an inorganic material.

The gate electrode GAT may be disposed on the first insulation layer 212. In an embodiment, the gate electrode GAT may overlap the channel region of the active layer ACT.

The second insulation layer 214 may be disposed on the first insulation layer 212. The second insulation layer 214 may cover the gate electrode GAT and may have substantially the same thickness along a profile of the gate electrode GAT.

The source electrode SE and the drain electrode DE may be disposed on the second insulation layer 214. The source electrode SE may contact the source region of the active layer ACT through a first contact hole formed in the first and second insulation layers 212 and 214. The drain electrode DE may contact the drain region of the active layer ACT through a second contact hole formed in the first and second insulation layers 212 and 214.

The third insulation layer 216 may be disposed on the second insulation layer 214. The third insulation layer 216 may cover the source and drain electrodes SE and DE, and have a substantially flat upper surface without a stepped change in height around the source and drain electrodes SE and DE. The third insulation layer 216 may be formed of an organic material.

The first electrode E1 may be disposed on the third insulation layer 216. The first electrode E1 may have reflective or transmissive properties. For example, the first electrode E1 may be formed of a metal.

The pixel defining layer PDL may be disposed on the third insulation layer 216, and an opening exposing an upper surface of the first electrode E1 may be formed in the pixel defining layer PDL. The pixel defining layer PDL may be formed of an organic material or an inorganic material.

The gap maintaining member SPC may be disposed on the pixel defining layer PDL. The gap maintaining member SPC may be formed of an organic material or an inorganic material. The gap maintaining member SPC may maintain a gap between the encapsulation layer 300 and the substrate 100.

The gap maintaining member SPC may include a material different from that of the pixel defining layer PDL. The gap maintaining member SPC may be formed after the pixel defining layer PDL is formed. However, embodiments according to the present disclosure are not necessarily limited thereto, and the gap maintaining member SPC may include the same material as the pixel defining layer PDL. For example, the pixel defining layer PDL and the gap maintaining member SPC may include an organic material such as polyimide. The pixel defining layer PDL and the gap maintaining member SPC may be simultaneously formed, for example, using a halftone mask.

The light emitting layer EL may be disposed on the first electrode E1. The light emitting layer EL may be disposed in the opening formed in the pixel defining layer PDL. In an embodiment, the light emitting layer EL may have a multilayer structure which includes a hole injection layer, a hole transport layer, an organic light emitting layer, an electron transport layer, and an electron injection layer. The organic light emitting layer may include a light emitting material.

The second electrode E2 may cover the light emitting layer EL and may be disposed on the pixel defining layer PDL and the gap maintaining member SPC. In an embodiment, the second electrode E2 may have a plate shape. In addition, the second electrode E2 may have transmissive or reflective properties. The second electrode E2 may be formed of a metal.

The encapsulation layer 300 may prevent moisture and oxygen from penetrating into the light emitting diode layer 220 from the outside. The encapsulation layer 300 may have a multilayer structure, and may include a first inorganic encapsulation layer 310, an organic encapsulation layer 320, and a second inorganic encapsulation layer 330.

The first inorganic encapsulation layer 310 may be disposed on the second electrode E2 and may have substantially the same thickness along a profile of the second electrode E2. The organic encapsulation layer 320 may be disposed on the first inorganic encapsulation layer 310, and may have a substantially flat upper surface without a stepped change in height around the first inorganic encapsulation layer 310. The second inorganic encapsulation layer 330 may be disposed on the organic encapsulation layer 320.

Figure 4:
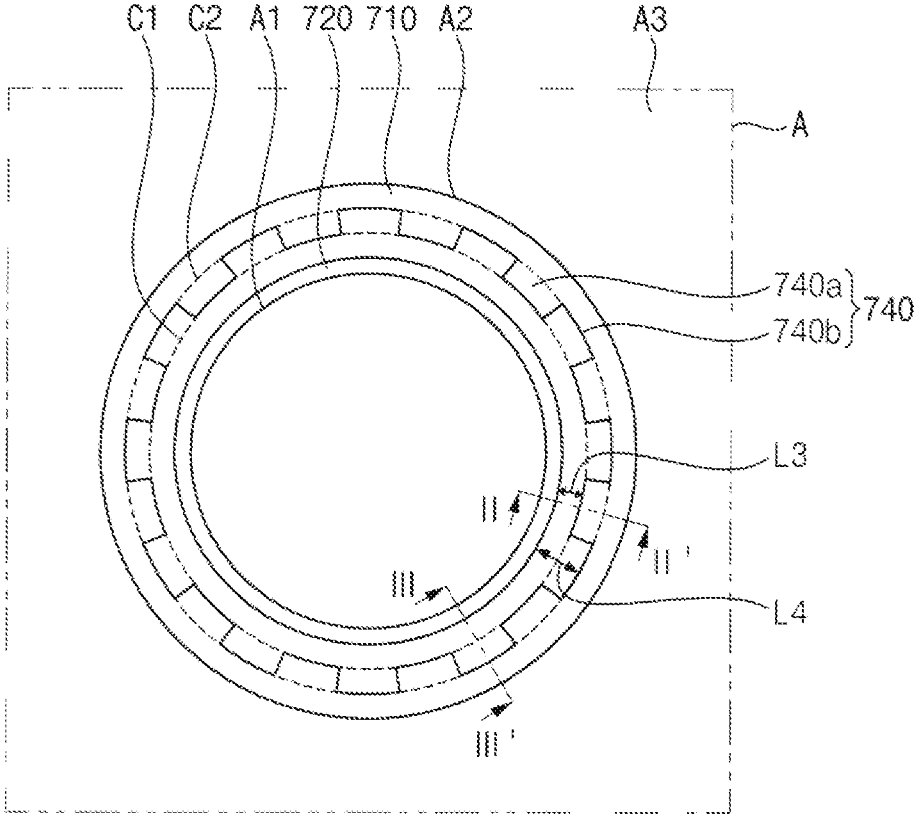
FIG. 4 is an enlarged plan view of area A of a display panel included in the display device of FIG. 1.
Figure 5:
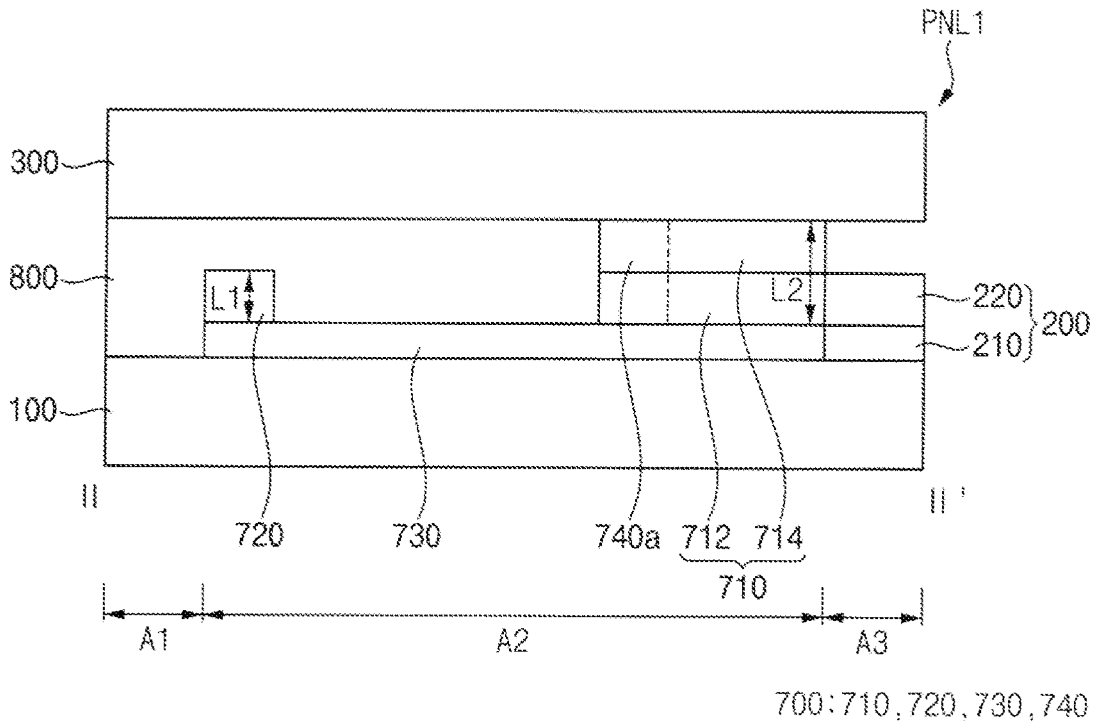
FIG. 5 is a cross-sectional view taken along line II-IF of FIG. 4.
Figure 6:
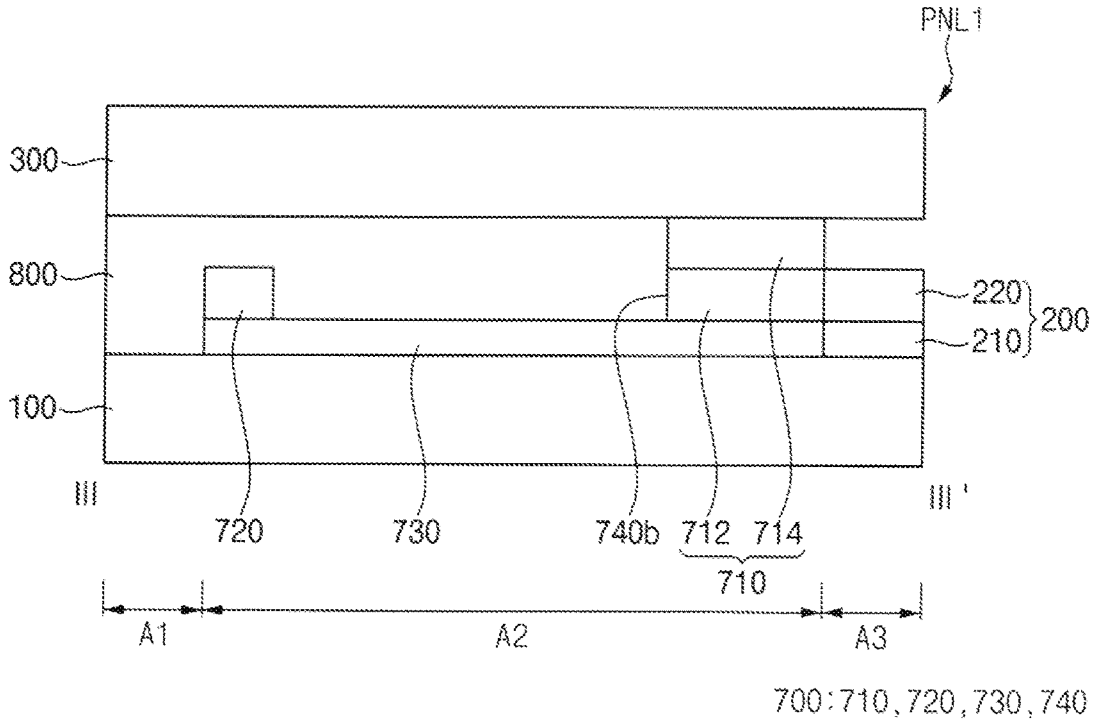
FIG. 6 is a cross-sectional view taken along line of FIG. 4.

FIG. 4 is an enlarged plan view of area A of a display panel included in the display device of FIG. 1. FIG. 5 is a cross-sectional view taken along line II-IF of FIG. 4. FIG. 6 is a cross-sectional view taken along line of FIG. 4.

For example, an area A may be an enlarged plan view of the first area A1 and the second area A2 of FIG. 1. FIG. 5 corresponds to a convex portion included in a concave-convex structure of FIG. 4, and FIG. 6 corresponds to a concave part included in the uneven structure of FIG. 4.

Referring to FIGS. 1 to 6, the barrier part 700 may include a first partition 710, a second partition 720, and a barrier insulation layer 730.

The barrier insulation layer 730 may be disposed on the substrate 100. The barrier insulation layer 730 may be disposed on the same layer as the third insulation layer 216 disposed in the third area A3. The barrier insulation layer 730 may be formed of an organic material. Examples of the organic material included the barrier insulation layer 730 include a photoresist, an acrylic resin, a polyimide-based resin, a polyamide-based resin, and a siloxane-based resin. For example, the barrier insulation layer 730 may include polyimide.

Since, in an embodiment, the barrier insulation layer 730 includes polyimide, the barrier insulation layer 730 may have a lesser surface tension than the substrate 100 including glass. Accordingly, a filling material forming the filling layer 800 may diffuse faster on the barrier insulation layer 730 than on the substrate 100.

The first partition 710 may be disposed on the barrier insulation layer 730. The first partition 710 may be adjacent to the third area A3. The first partition 710 may extend along a boundary between the second area A2 and the third area A3.

The first partition 710 may include a first layer 712 and a second layer 714. The first layer 712 may be disposed on the barrier insulation layer 730. The first layer 712 may be disposed on the same layer as the pixel defining layer PDL disposed in the third area A3. The second layer 714 may be disposed on the first layer 712. The second layer 714 may be disposed on the same layer as the gap maintaining member SPC disposed in the third area A3.

However, the present disclosure is not necessarily limited thereto, and the first partition 710 may be formed as a single layer. For example, the first layer 712 and the second layer 714 may be integrally formed.

The second partition 720 may be disposed on the barrier insulation layer 730 and may be spaced apart from the first partition 710. The second partition 720 may be adjacent to the first area A1. The second partition 720 may at least partially surround the first area A1. For example, the second partition 720 may surround the first area A1 in a plane that is parallel to a front surface of the display device 10. The second partition 720 may extend along a boundary between the first area A1 and the second area A2. The second partition 720 may be disposed on the same layer as the first layer 712 included in the first partition 710 and the pixel defining layer PDL disposed in the third area A3.

A thickness L1 of the second partition 720 may be less than a thickness L2 of the first partition 710. The thickness L2 of the first partition 710 may be substantially the same as a length between an upper surface of the barrier insulation layer 730 and a lower surface of the encapsulation layer 300. The first partition 710 may contact the barrier insulation layer 730 and the encapsulation layer 300. Since the first partition 710 contacts the barrier insulation layer 730 and the encapsulation layer 300, overflow of the filling layer 800 into the third area A3, for example, during a manufacturing process, may be prevented.

The thickness L1 of the second partition 720 may be less than a length between the upper surface of the barrier insulation layer 730 and the lower surface of the encapsulation layer 300. In an embodiment of the disclosure, the second partition 720 does not contact the encapsulation layer 300. Accordingly, the filling layer 800 may charge the first area A1 and the second area A2.

In an embodiment, the first partition 710 may include a concave-convex structure 740 on a surface facing the first area A1. For example, the concave-convex structure 740 may have a shape in which convex portions protrude in a direction from the second area A2 to the first area A1. A surface of the first partition 710 facing the third area A3 may be a smooth curved surface which does not include the concave-convex structure.

For example, each of the first layer 712 and the second layer 714 included in the first partition 710 may include the concave-convex structure 740 on a surface which faces the first area A1 in a plan view. Accordingly, the concave-convex structure 740 may be configured in multiple layers. However, embodiments according to the present disclosure are not necessarily limited thereto, and the concave-convex structure 740 may be formed in a single layer.

In an embodiment, the concave-convex structure 740 may include convex portions 740*a* and concave portions 740*b*. The convex portions 740*a* may protrude in a direction from the second area A2 to the first area A1. The concave portions 740*b* may be respectively positioned between adjacent convex portions among the convex portions 740*a*. For example, the convex portions 740*a* and the concave portions 740*b* may be alternately disposed.

A length L3 between the second partition 720 and each of the convex portions 740*a* may be less than a length L4 between the second partition 720 and each of the concave portions 740*b* in a plan view.

In an embodiment, the number of the convex portions 740*a* and the concave portions 740*b* is not necessarily limited to a certain number. That is, the number of the convex portions 740*a* and the concave portions 740*b* may be greater than the number illustrated in FIG. 4. The number of the convex portions 740*a* and the concave portions 740*b* may be two or more and less than the number illustrated in FIG. 4.

The concave-convex structure 740 may have a saw tooth or gear-like shape. However, embodiments according to the present disclosure are not necessarily limited thereto, and the concave-convex structure 740 may have other concave-convex shapes such as a wavy shape.

A circumference of the surface of the concave-convex structure 740 may be greater than a circumference of a first circle C1. The first circle C1 may be a circle whose radius is a length between the center of the first area A1 and the surface of each of the convex portions 740*a*.

The circumference (e.g., a total perimeter) of the surface of the concave-convex structure 740 may be greater than a circumference of a second circle C2. The second circle C2 may be a circle whose radius is a length between the center of the first area A1 and the surface of each of the concave portions 740*b*.

In an embodiment, since the first partition 710 includes the concave-convex structure 740, the circumference of the surface of the first partition 710 facing the first area A1 may increase. Accordingly, the charging rate of the filling material in the second area A2 may be reduced. For example charging rate of the filling material in the first area A1 may be similar to the charging rate of the filling material in the second area A2. Since the charging rate of the filling material in the second area A2 is similar to the charging rate of the filling material in the first area A1, the filling layer 800 may charge the first area A1 before the second region A2. The filling layer 800 may completely charge a space in the first area A1 on the substrate 100. Accordingly, it is possible to prevent a problem where the filling layer 800 does not charge the space in the first area A1 on the substrate 100.

Figure 7:
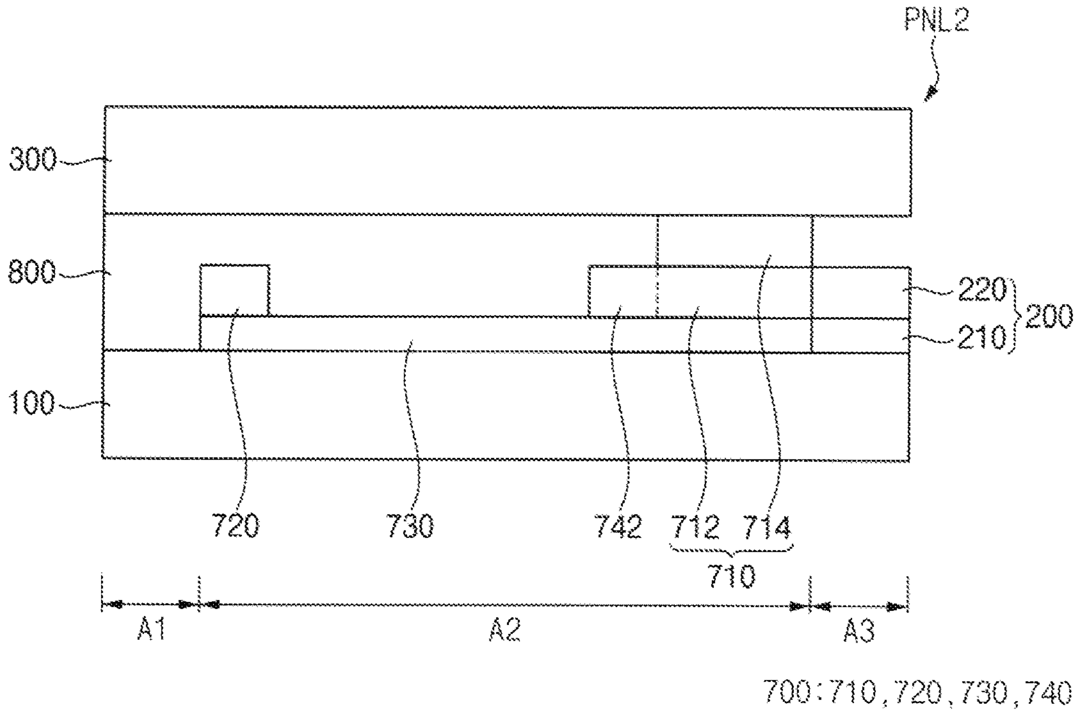
FIG. 7 is a cross-sectional view that illustrates another example of FIG. 5.

FIG. 7 is a cross-sectional view that illustrates another example of FIG. 5.

In a first partition 710 included in a display panel PNL2 described with reference to FIG. 7, components which are the same as the first partition 710 included in the display panel PNL1 described with reference to FIGS. 5 and 6 may be omitted so as to avoid redundancy in the description below.

Referring to FIG. 7, the first partition 710 may include a concave-convex structure 742 on a surface facing the first area A1 in a plan view. For example, the first layer 712 included in the first partition 710 may include the concave-convex structure 742 on a surface facing the first area A1 in a plan view. In this example, only the first layer 712 may include the concave-convex structure 742, and the second layer 714 may include a curved surface in which the surface facing the first area A1 which does not include the concave-convex structure in a plan view. Accordingly, the concave-convex structure 744 may be configured as a single layer.

In an embodiment, as only the first layer 712 includes the concave-convex structure 742, and the second layer 714 has the curved surface, a charging rate of the filling material in the second area A2 may be reduced. Accordingly, the charging rate of the filling material in the second area A2 may be similar to a charging rate of the filling material in the first area A1, and the filling layer 800 may charge the first area A1 before the second area A2.

Figure 8:
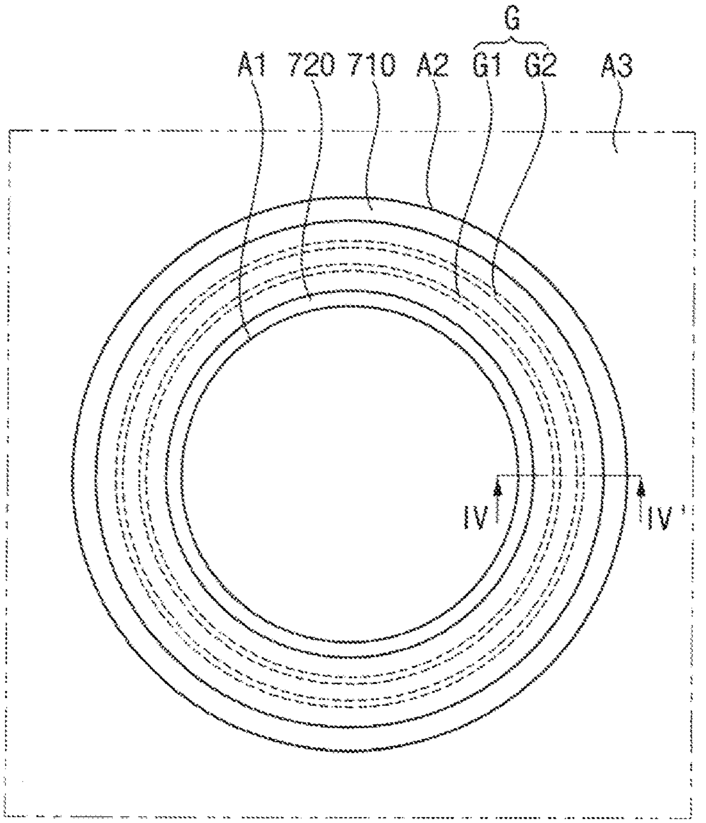
FIG. 8 is a plan view that illustrates another example of FIG. 4.
Figure 9:
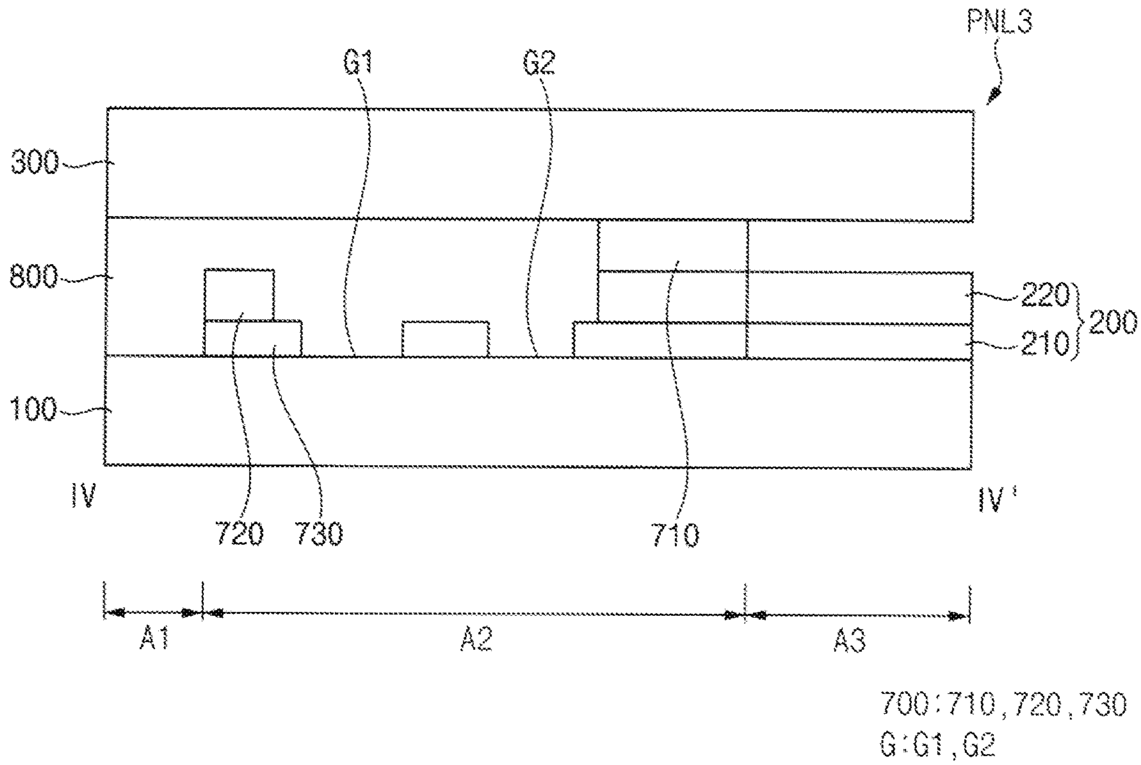
FIG. 9 is a cross-sectional view taken along line IV-IV' of FIG. 8.

FIG. 8 is a plan view that illustrates another example of FIG. 4. FIG. 9 is a cross-sectional view taken along line IV-IV' of FIG. 8.

In a display panel PNL3 described with reference to FIGS. 8 and 9, components which are the same as the display panel PNL1 described with reference to FIGS. 4 to 6 may be omitted so as to avoid redundancy in the description below.

Referring to FIGS. 1, 2, 3, 8 and 9, a display panel PNL3 may include a substrate 100, a filling layer 800, a barrier part 700, a display element layer 200, and an encapsulation layer 300. The barrier part 700 may include a first partition 710, a second partition 720, and a barrier insulation layer 730.

The barrier insulation layer 730 may be disposed on the substrate 100. The first partition 710 may be disposed on the barrier insulation layer 730. The first partition 710 may be adjacent to the third area A3. The first partition 710 may extend along a boundary between the second area A2 and the third area A3. The second partition 720 may be disposed on the barrier insulation layer 730 and may be spaced apart from the first partition 710. The second partition 720 may be adjacent to the first area A1. For example, the second partition 720 may surround the first area A1 and may extend along a boundary between the first area A1 and the second area A2.

The barrier insulation layer 730 may define a groove G. The groove G may overlap the second area A2. The groove G may be defined between the first area A1 and the third area A3. For example, the groove G may be spaced apart from the first area A1 and may surround the first area A1 in a plan view. For example, the groove G may have a donut shape.

In an embodiment, the barrier insulation layer 730 may define a plurality of grooves G1 and G2 spaced apart from each other. For example, the barrier insulation layer 730 may define a first groove G1 and a second groove G2, as illustrated in FIG. 9.

The first groove G1 and the second groove G2 may overlap the second area A2. The first groove G1 may be spaced apart from the first area A1, and the second groove G2 may be spaced apart from the third area A3. The first groove G1 may be spaced apart from the second partition 720, and the second groove G2 may be spaced apart from the first partition 710. The first groove G1 may be adjacent to the first area A1 and surround the first area A1. The second groove G2 may be adjacent to the first partition 710 and may surround the first groove G1. For example, each of the first groove G1 and the second groove G2 may have a donut shape. For example, the first groove G1 and the second groove G2 may be concentric with each other.

Each of the first groove G1 and the second groove G2 may expose an upper surface of the substrate 100. For example, each of the first groove G1 and the second groove G2 may vertically penetrate the barrier insulation layer 730. In this case, a depth of each of the first groove G1 and the second groove G2 may be substantially the same as a thickness of a portion of the barrier insulation layer 730 in which the groove is not defined (e.g., a portion of the barrier insulation layer 730 overlapping the first partition 710 or the second partition 720).

In an embodiment, the barrier insulation layer 730 may further define a third groove. The third groove may be defined between the second groove G2 and the first partition 710, and may surround the second groove G2. In an embodiment including the third groove, the three grooves may be substantially concentric with each other.

In an embodiment, since the first partition 710 includes the first groove G1 and the second groove G2, a volume of the space between the encapsulation layer 300 and the barrier insulation layer 730 in the second area A2 may increase. Accordingly, a charging rate of the filling layer 800 in the second area A2 may decrease and the charging rate of the filling material in the first area A1 may be similar to the charging rate of the filling material in the second area A2. Since the charging rate of the filling material in the second area A2 is similar to the charging rate of the filling material in the first area A1, the filling layer 800 may charge the first area A1 before the second area A2. The filling layer 800 may completely charge a space in the first area A1 on the substrate 100. Accordingly, it is possible to prevent a manufacturing issue wherein the filling layer 800 does not fully charge the space in the first area A1 on the substrate 100. For example, in some conventional display devices where this space is not fully charged, light may be deflected or otherwise not efficiently pass through to a functional module disposed between the filling layer. In a display device according to the present disclosure, this defect may be prevented.

Figure 10:
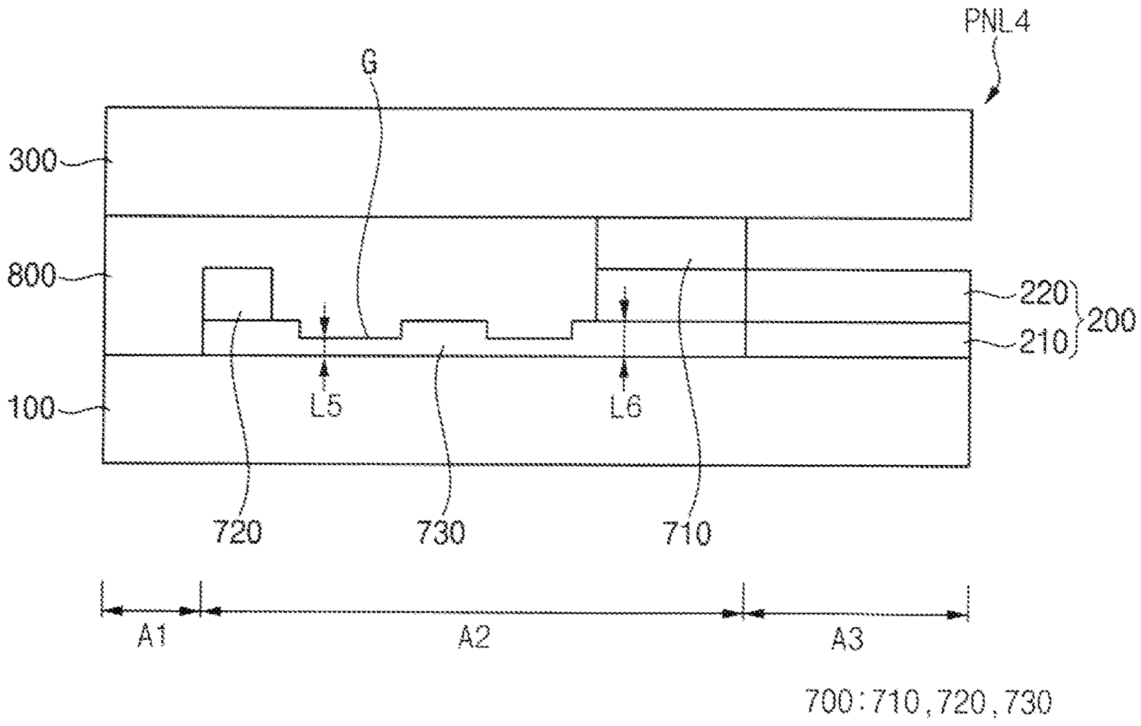
FIG. 10 is a cross-sectional view that illustrates another example of FIG. 9.

FIG. 10 is a cross-sectional view that illustrates another example of FIG. 9.

Referring to FIG. 10, the first groove G1 and the second groove G2 might not expose the upper surface of the substrate 100 unlike in FIG. 9. That is, each of the first and second grooves G1 and G2 might not penetrate vertically through the barrier insulation layer 730 and may be defined only on an upper surface of the barrier insulation layer 730. In this case, the depth of each of the first and second grooves G1 and G2 may be less than a thickness of a portion of the barrier insulation layer 730 in which the first and second grooves G1 and G2 are not defined (e.g., a portion of the barrier insulation layer 730 overlapping the first partition 710 or the second partition 720). For example, a length L5 from a lower surface of the first groove G1 to the upper surface of the substrate 100 may be less than a length L6 from a lower surface of the first partition 710 to the upper surface of the substrate 100.

Figure 11:
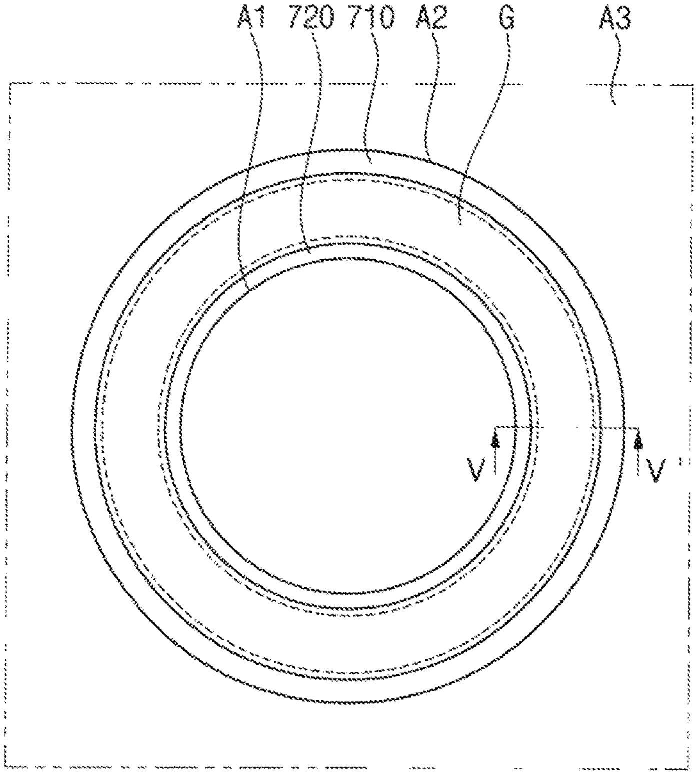
FIG. 11 is a plan view that illustrates another example of FIG. 4.
Figure 12:
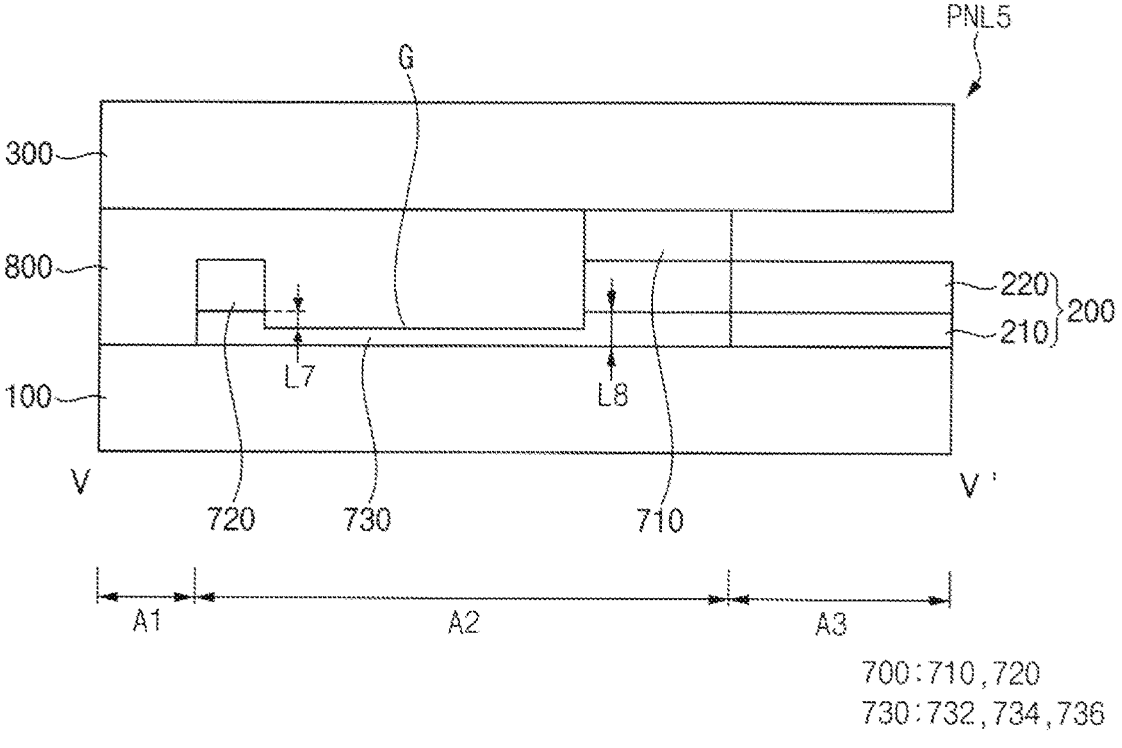
FIG. 12 is a cross-sectional view taken along line V-V' of FIG. 11.

FIG. 11 is a plan view that illustrates another example of FIG. 4. FIG. 12 is a cross-sectional view taken along line V-V' of FIG. 11.

In a display panel PNL5 described with reference to FIGS. 11 and 12, components which are the same as the display panel PNL1 described with reference to FIGS. 4 to 6 may omitted so as to avoid redundancy in the description below.

Referring to FIGS. 1, 2, 3, 11 and 12, a display panel PNL5 may include a substrate 100, a filling layer 800, a barrier part 700, a display element layer 200, and an encapsulation layer 300. The barrier part 700 may include a first partition 710, a second partition 720, and a barrier insulation layer 730.

The barrier insulation layer 730 may be disposed on the substrate 100. The first partition 710 may be disposed on the barrier insulation layer 730. The first partition 710 may be adjacent to the third area A3. The first partition 710 may extend along a boundary between the second area A2 and the third area A3. The second partition 720 may be disposed on the barrier insulation layer 730 and may be spaced apart from the first partition 710. The second partition 720 may be adjacent to the first area A1. The second partition 720 may surround the first area A1 and may extend along a boundary between the first area A1 and the second area A2.

In an embodiment, the barrier insulation layer 730 may define a groove G. The groove G may overlap the second area A2. The groove G may be spaced apart from the first area A1 and the third area A3. The groove G may be spaced apart from the second partition 720 and the first partition 710. The groove G may be adjacent to the first area A1 and may surround the first area A1. For example, the groove G may have a donut shape.

A depth L7 of the groove G may be less than a thickness of a portion of the barrier insulation layer 730 in which the groove G is not defined (e.g., a portion of the barrier insulation layer 730 overlapping the first partition 710 or the second partition 720). The groove G may be formed using a halftone mask during a manufacturing process of the display panel PNL5. The barrier insulation layer 730 between the first partition 710 and the second partition 720 may be etched to form the groove G.

In an embodiment, since the first partition 710 includes the groove G, a volume of a space between the encapsulation layer 300 and the barrier insulation layer 730 in the second area A2 may increase. Accordingly, a charging rate of the filling layer 800 in the second area A2 may decrease, and the charging rate of the filling material in the first area A1 may be similar to the charging rate of the filling material in the second area A2. Since the charging rate of the filling material in the second area A2 is similar to the charging rate of the filling material in the first area A1, the filling layer 800 may charge the first area A1 before the second area A2. In a manufacturing process of a display device according to the present disclosure, the filling layer 800 may completely charge a space in the first area A1 on the substrate 100.

Figure 13:
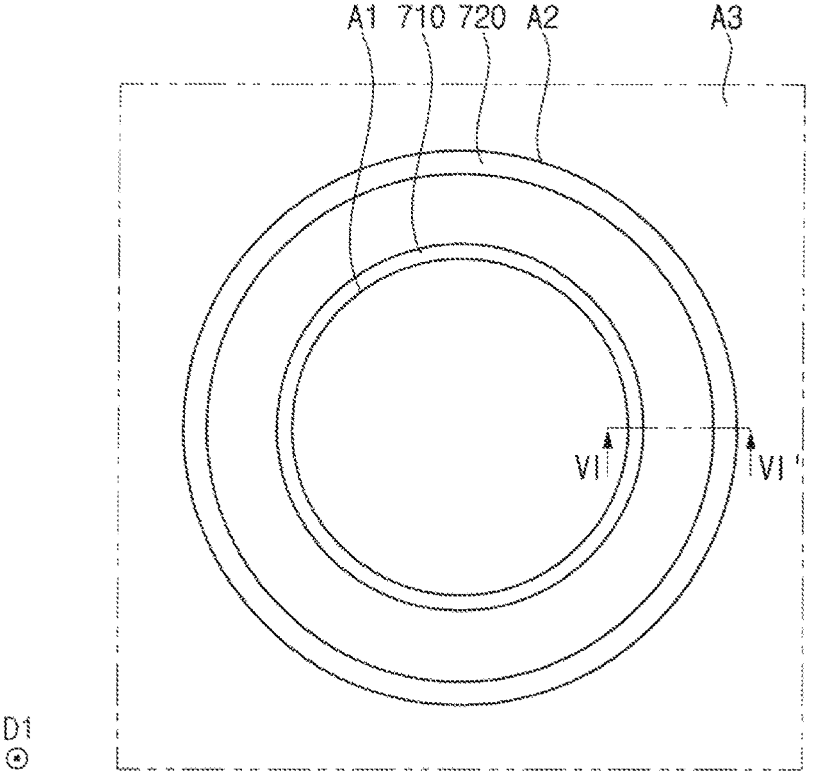
FIG. 13 is a plan view that illustrates another example of FIG. 4.
Figure 14:
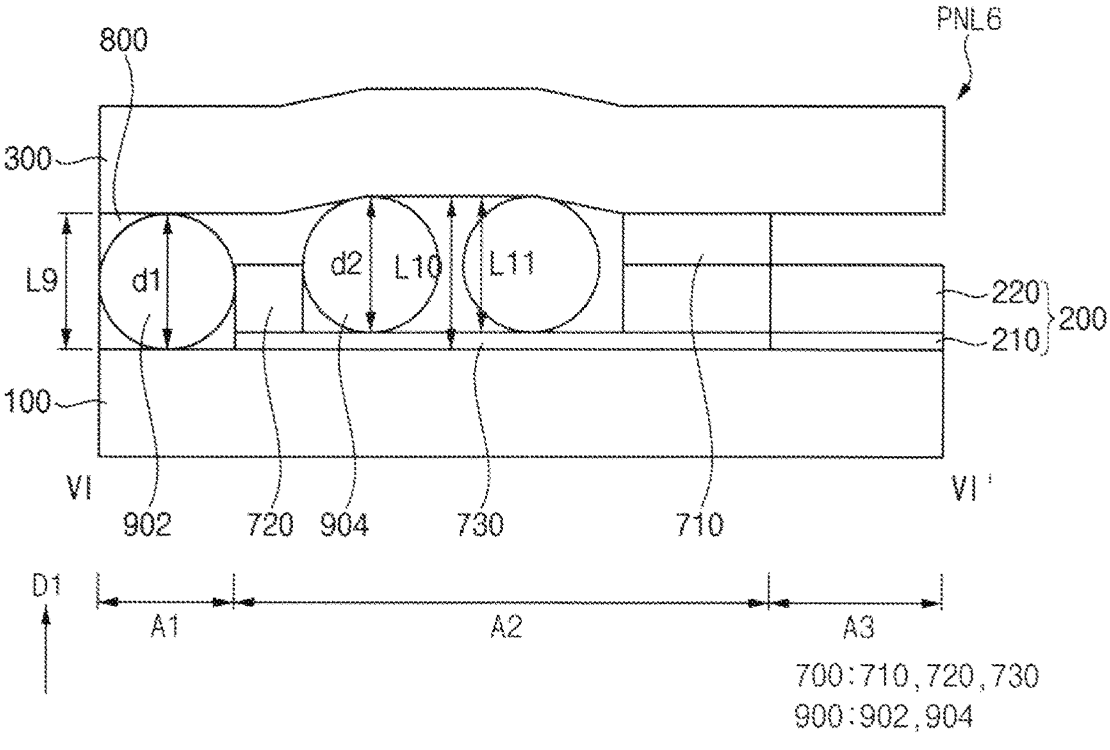
FIG. 14 is a cross-sectional view taken along line VI-VI' of FIG. 13.

FIG. 13 is a plan view that illustrates another example of FIG. 4. FIG. 14 is a cross-sectional view taken along line VI-VI' of FIG. 13.

In a display panel PNL6 described with reference to FIGS. 13 and 14, components which are the same as the display panel PNL1 described with reference to FIGS. 4 to 6 may be omitted so as to avoid redundancy in the description below.

Referring to FIGS. 1, 2, 3, 13 and 14, the display panel PNL6 may include a substrate 100, a filling layer 800, a barrier part 700, a display element layer 200, and a spacer 900 and the encapsulation layer 300. The barrier part 700 may include a first partition 710, a second partition 720, and a barrier insulation layer 730.

The barrier insulation layer 730 may be disposed on the substrate 100. The first partition 710 may be disposed on the barrier insulation layer 730. The first partition 710 may be adjacent to the third area A3. The first partition 710 may extend along a boundary between the second area A2 and the third area A3. The second partition 720 may be disposed on the barrier insulation layer 730 and may be spaced apart from the first partition 710. The second partition 720 may be adjacent to the first area A1. The second partition 720 may surround the first area A1 and may extend along a boundary between the first area A1 and the second area A2. The spacer 900 may be disposed in the first area A1 on the substrate 100 and/or in the second area A2 on the barrier insulation layer 730. In an embodiment, the spacer 900 may include a first spacer 902 and a second spacer 904.

In this case, the first spacer 902 may be disposed in the first area A1 on the substrate 100. The second spacer 904 may be spaced apart from the first spacer 902 and may be disposed in the second area A2 on the barrier insulation layer 730.

The second partition 720 may be disposed between the first spacer 902 and the second spacer 904. The first spacer 902 and the second spacer 904 may overlap the filling layer 800. The filling layer 800 may surround the first spacer 902 and the second spacer 904. The encapsulation layer 300 may be disposed on the first spacer 902 and the second spacer 904.

In an embodiment, the first spacer 902 and the second spacer 904 may have substantially the same volume. For example, each of the first spacer 902 and the second spacer 904 may have a sphere shape having the same volume. In an embodiment, the first spacer 902 and the second spacer 904 may each have a toroidal shape that extends around the first area A1. However, embodiments according to the present disclosure are not necessarily limited thereto, and each of the first spacer 902 and the second spacer 904 may have a shape such as a polyhedron such as a cuboid shape.

The first spacer 902 and the second spacer 904 may be formed of substantially the same material. The first spacer 902 and the second spacer 904 may be formed of a flexible material. Accordingly, the substrate 100, the barrier insulation layer 730, and the encapsulation layer 300 may not be damaged by the first spacer 902 and the second spacer 904. For example, the first spacer 902 and the second spacer 904 may deform to fit the boundaries of the substrate 100, the barrier insulation layer 730, and the encapsulation layer 300.

The first spacer 902 and the second spacer 904 may be formed of the same material, but a thickness d1 of the first spacer 902 in a first direction D1 and a thickness d2 of the second spacer 904 in the first direction D1 may be different from each other. The first direction D1 may be a direction from the substrate 100 to the encapsulation layer 300. Since the first spacer 902 and the second spacer 904 are flexible, they may have a sphere shape that is partially deformed since they are pressed by the encapsulation layer 300 and the barrier insulation layer 730, respectively. A length L9 in the first direction D1 between the encapsulation layer 300 and the substrate 100 on which the first spacer 902 is disposed may be greater than a length L11 in the first direction D1 between the encapsulation layer 300 and the barrier insulation layer 730 on which the second spacer 904. A deformation of the second spacer 904 may be relatively greater than a deformation of the first spacer 902. Accordingly, the thickness d1 of the first spacer 902 may be greater than the thickness d2 of the second spacer 904.

In an embodiment, the length L9 between the upper surface of the substrate 100 and the lower surface of the encapsulation layer 300 in the first area A1 may be less than the length L10 between the upper surface of the substrate 100 and the lower surface of the encapsulation layer 300 in the second area A1. In addition, the thicknesses d1 of the first spacer 902 and the thickness d2 of the second spacer 904 may be similar to the length L9 between the upper surface of the substrate 100 and the lower surface of the encapsulation layer 300 in the first area A1.

A portion of the encapsulation layer 300 which overlaps the second area A2 may be located higher in the first direction D1 than a portion of the encapsulation layer 300 overlapping the first area A1. Due to the barrier insulation layer 730 disposed in the second area A2, a portion of the encapsulation layer 300 overlapping the second area A2 may be located relatively higher than a portion of the encapsulation layer 300 overlapping the first area A1.

In an embodiment, since the first spacer 902 is disposed between the encapsulation layer 300 and the substrate 100, and the second spacer 904 is disposed between the encapsulation layer 300 and the barrier insulation layer 730, a length between the encapsulation layer 300 and the barrier insulation layer 730 in the second area A2 may increase. For example is, the length between the encapsulation layer 300 and the substrate 100 in the first area A1 may be similar to the length between the encapsulation layer 300 and the barrier insulation layer 730 in the second area A2. Accordingly, the volume of the space between the encapsulation layer 300 and the barrier insulation layer 730 in the second area A2 may increase. Accordingly, a charging rate of the filling layer 800 in the second area A2 may decrease and the charging rate of the filling material in the first area A1 may be similar to the charging rate of the filling material in the second area A2. The filling layer 800 may completely charge a space in the first area A1 on the substrate 100.

FIGS. 15 to 20 are views that illustrate a method of manufacturing a display panel according to an embodiment. For example, FIGS. 15 to 20 may be views that illustrate a method of manufacturing the display panel PNL1 of FIG. 5.

Figure 15:
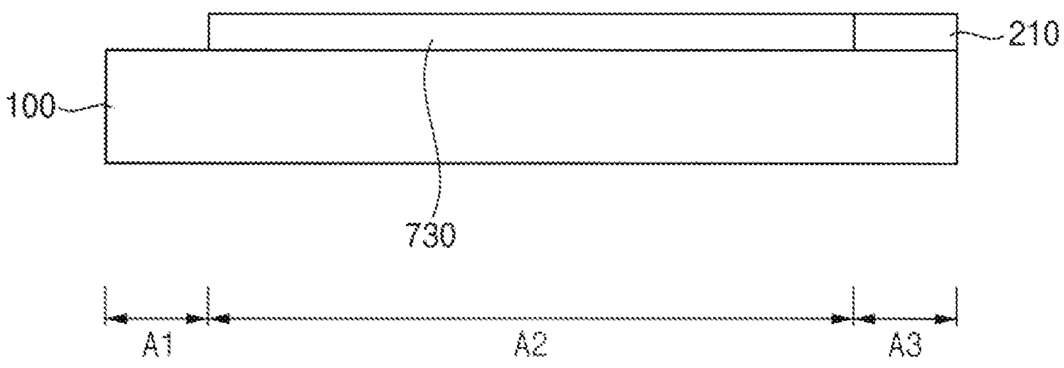
FIGS. 15 to 20 are views that illustrate a method of manufacturing a display panel according to an embodiment.

Referring to FIG. 15, a barrier insulation layer 730 may be formed in a second area A2 on the substrate 100, and a circuit element layer 210 may be formed in a third area A3 on the substrate 100.

Figure 16:
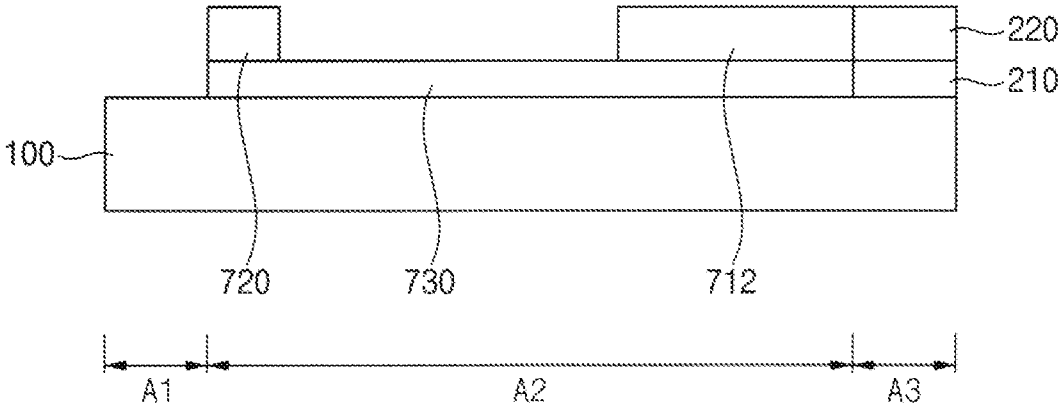

Referring to FIG. 16, a first layer 712 and a second partition 720 may be formed in the second area A2 on the barrier insulation layer 730. The first layer 712 may be adjacent to the third area A3, and the second partition 720 may be adjacent to the first area A1. The light emitting diode layer 220 may be disposed in the third area A3 on the circuit element layer 210. The first layer 712 and the second partition 720 may be simultaneously formed with a pixel defining layer (e.g., the pixel defining layer PDL of FIG. 3) in the third area A3.

Figure 17:
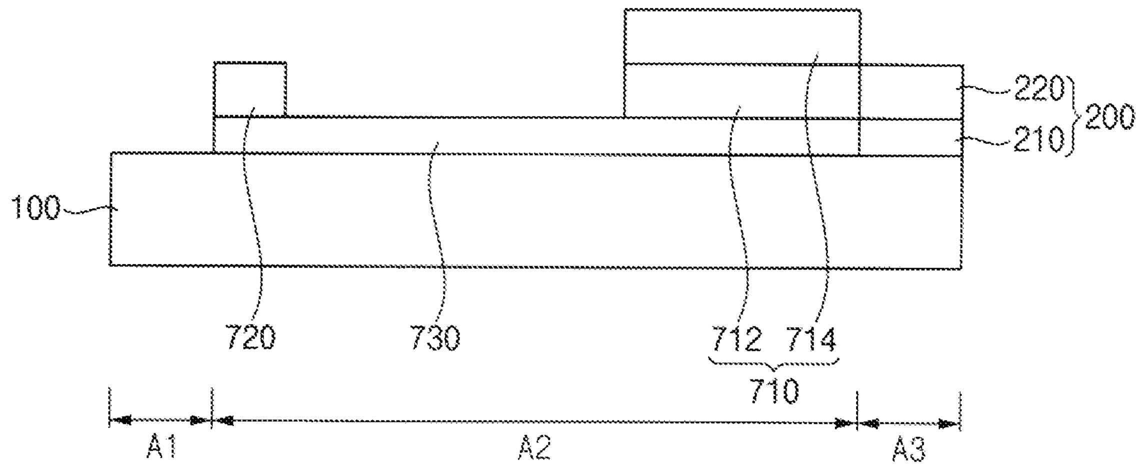

Referring to FIG. 17, a second layer 714 may be formed in the second area A2 on the first layer 712. The first layer 712 and the second layer 714 may form a first partition 710. However, embodiments according to the present disclosure are not necessarily limited thereto, and the second layer 714 may be simultaneously formed with a gap maintaining member (e.g., the gap maintaining member SPC of FIG. 3) in the third area A3. The first layer 712 and the second layer 714 may be integrally formed. For example, the first layer 712 and the second layer 714 may be simultaneously formed using a halftone mask.

Figure 18:
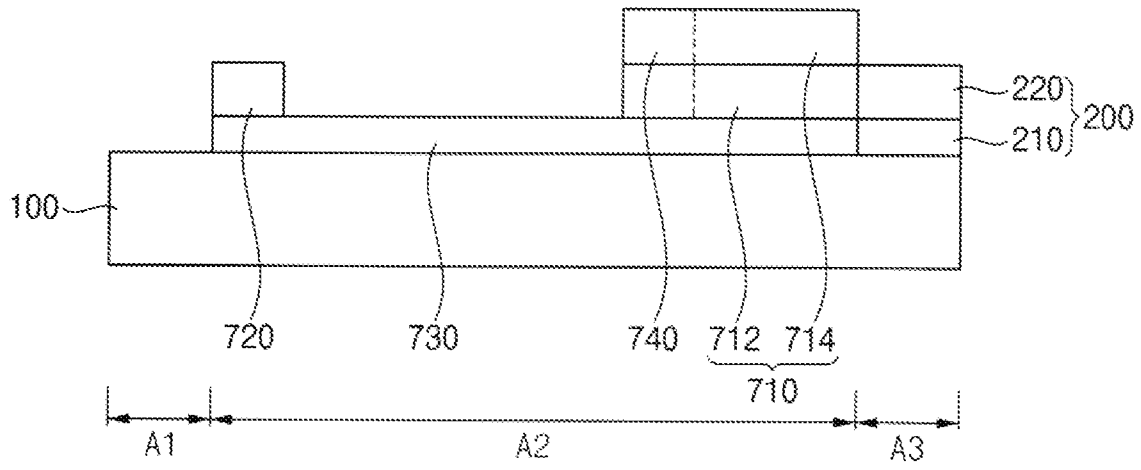

Referring to FIG. 18, a concave-convex structure 740 may be formed on a surface which faces the first area A1 of the first partition 710. That is, the surface facing the first area A1 of the first partition 710 may be etched to form the concave-convex structure 740. That is, the first layer 712 and the second layer 714 may be partially etched at the same time.

The concave-convex structure 740 may include convex portions (e.g., convex portions 740*a* of FIG. 4) and concave portions (e.g., concave portions 740*b* of FIG. 4). The convex portions 740*a* may be formed to protrude from the second area A2 towards the first area A1. The concave portions 740*b* may be respectively formed between two adjacent convex portions 740*a* among the convex portions 740*a*.

Figure 19:
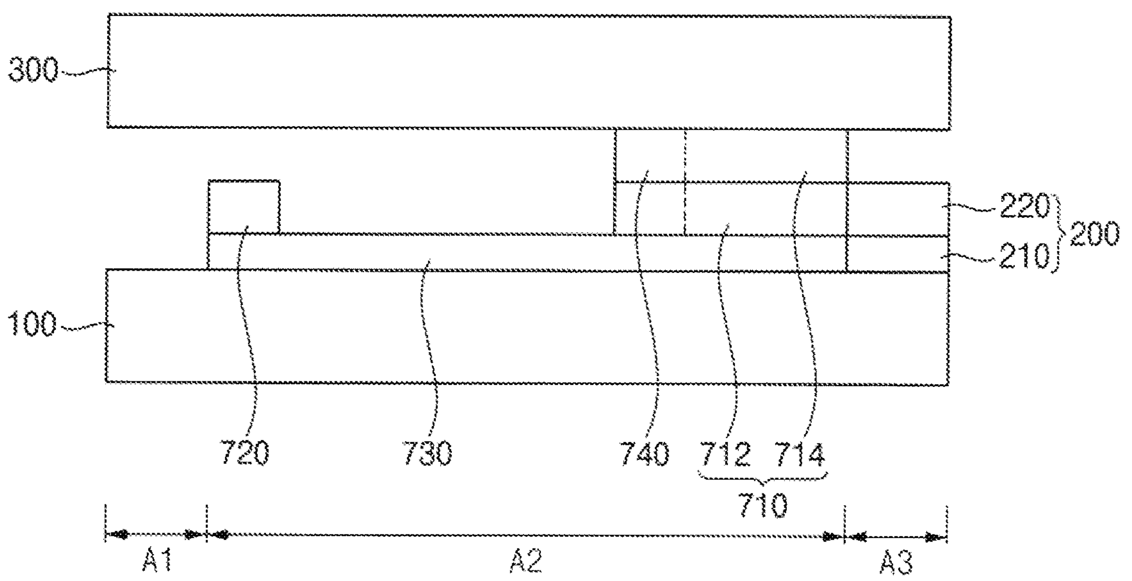

Referring to FIG. 19, an encapsulation layer 300 may be formed on the first partition 710. The encapsulation layer 300 may contact the upper surface of the first partition 710.

Figure 20:
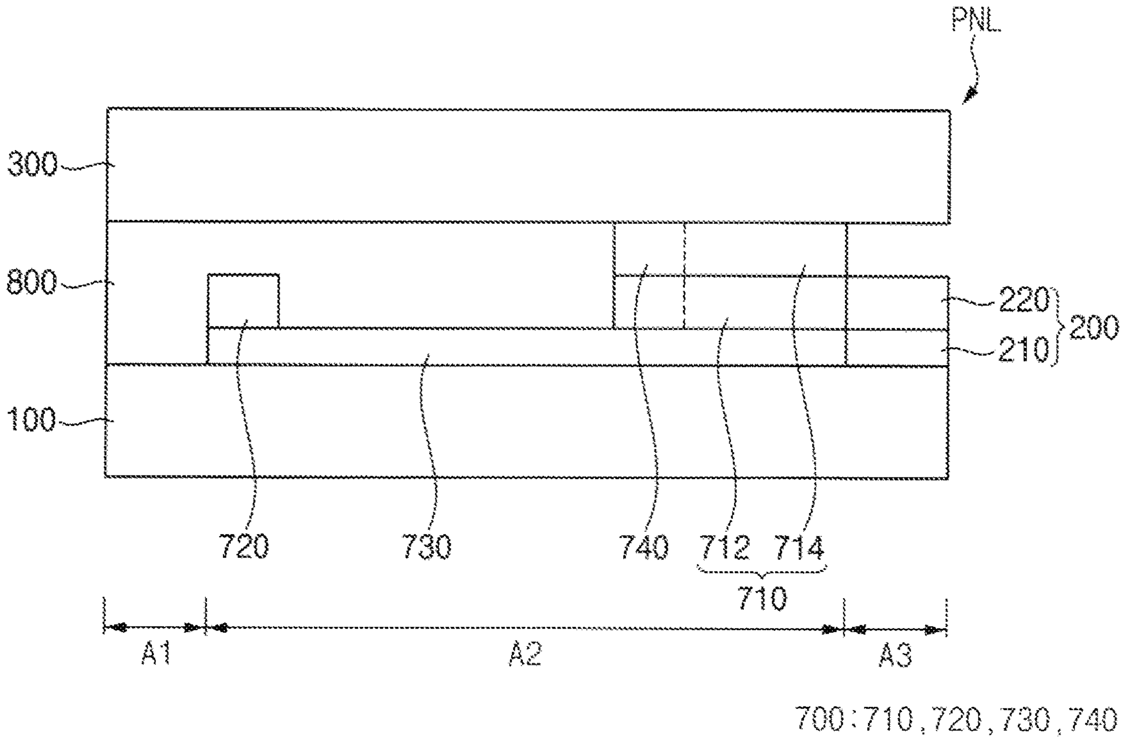

Referring to FIG. 20, a filling layer 800 may be formed in the first area A1 and the second area A2. In the first area A1, the filling layer 800 may be filled between the encapsulation layer 300 and the substrate 100, and in the second area A2, the filling layer 800 may be filled between the encapsulation layer 300 and the barrier insulation layer 730. First, a filling material of the filling layer 800 may charge the first area A1.

In an embodiment, the filling material may pass through the first area A1 to charge the second area A2. Since the concave-convex structure 740 is formed in the second area A2, the filling material in the second area A2 may be diffused along the concave-convex structure 740. Accordingly, the charging rate of the filling material in the second area A2 may be relatively lowered. In this case, the charging rate of the filling material in the first area A1 may be similar to the charging rate of the filling material in the second area A2. The filling material may completely charge a space between the encapsulation layer 300 and the substrate 100 in the first area A1, and then may charge a space between the encapsulation layer 300 and the barrier insulation layer 730 in the second area A2.

The display panel according to the embodiments may have a decreased defect rate during manufacturing, and may provide increased performance of a functional module disposed thereon. The display panel according to the embodiments may be applied to a display device included in a computer, a notebook, a mobile phone, a smartphone, a smart pad, a PMP, a PDA, an MP3 player, or the like.

Although the display panels according to the embodiments have been described with reference to the drawings, the illustrated embodiments are examples. For instance, a person of ordinary skill in the art may implement different shapes, number of grooves, or other arrangements of components to similarly regulate the charge rate of a similar fill layer and ensure an equivalent first area is filled before an equivalent second area. Accordingly, the disclosed embodiments may be modified and changed by a person having ordinary knowledge in the relevant technical field without departing from the technical spirit described in the following claims.

What is claimed is:

1. A display panel comprising:

a substrate including a circular first area, a second area at least partially surrounding the first area, and a third area at least partially surrounding the second area;

a barrier part disposed on the substrate in the second area, wherein the barrier part comprises a first partition including a concave-convex structure on a surface facing the first area, wherein the concave-convex structure includes convex portions and concave portions alternatively and repeatedly disposed along a circumferential direction about a center point of the first area in a plan view, wherein all of the convex portions extend towards the center point of the first area and all of the concave portions extend away from the center point of the first area;

a filling layer disposed on the substrate in the first area and the second area, adjacent to the concave-convex structure; and a light emitting diode layer disposed in the third area on the substrate and adjacent to the first partition, wherein an opening is disposed in the first area, wherein a pixel is disposed in the third area, and wherein the filling layer is spaced apart from the third area in the plan view.

2. The display panel of claim 1, wherein the convex portions protrude from the second area to the first area, and wherein the concave portions are each positioned between adjacent convex portions among the convex portions.

3. The display panel of claim 2, wherein the concave-convex structure has a volumetric gear shape.

4. The display panel of claim 2, wherein the barrier part further includes a second partition disposed in the second area on the substrate, wherein the second partition at least partially surrounds the first area, and wherein the second partition is spaced apart from the concave-convex structure.

5. The display panel of claim 4, wherein a thickness of the second partition is less than a thickness of the first partition.

6. The display panel of claim 4, wherein a length between the second partition and each of the convex portions is less than a length between the second partition and each of the concave portions.

7. The display panel of claim 4, wherein the barrier part further includes an insulation layer disposed in the second area on the substrate, and wherein the first partition and the second partition are disposed on the insulation layer.

8. The display panel of claim 7, wherein a surface tension of the insulation layer is less than a surface tension of the substrate.

9. The display panel of claim 1, wherein the first partition extends along a boundary between the second area and the third area.

* * * * *